(12) United States Patent
Nakazawa et al.

(10) Patent No.: US 10,115,587 B2
(45) Date of Patent: Oct. 30, 2018

(54) METHOD OF MANUFACTURING SEMICONDUCTOR DEVICE

(75) Inventors: Haruo Nakazawa, Matsumoto (JP);
Masaaki Ogino, Matsumoto (JP);
Hidenao Kuribayashi, Matsumoto (JP);
Hideaki Teranishi, Hachioji (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/879,371

(22) PCT Filed: Feb. 23, 2012

(86) PCT No.: PCT/JP2012/054434
§ 371 (c)(1),
(2), (4) Date: Jun. 11, 2013

(87) PCT Pub. No.: WO2013/125014
PCT Pub. Date: Aug. 29, 2013

(65) Prior Publication Data
US 2013/0260540 A1  Oct. 3, 2013

(51) Int. Cl.
*H01L 21/02* (2006.01)
*C30B 29/06* (2006.01)
(Continued)

(52) U.S. Cl.
CPC ........ *H01L 21/02373* (2013.01); *C30B 29/06* (2013.01); *C30B 33/02* (2013.01); *H01L 21/228* (2013.01); *H01L 29/66333* (2013.01)

(58) Field of Classification Search
CPC ...................................................... H01L 21/02
(Continued)

(56) References Cited

U.S. PATENT DOCUMENTS 6,264,906 B1   7/2001  Aihara et al.
7,741,192 B2   6/2010  Shimoyama et al.
(Continued)

FOREIGN PATENT DOCUMENTS

CN    101638807 A    2/2010
JP    03-193698 A    8/1991
(Continued)

OTHER PUBLICATIONS

Title: KR 10-2013-0073350 Machine Translation Translated date: Mar. 31, 2017 Publisher: European Patent office Pertinent Page: pp. 1-22*
Japanese Office Action dated Oct. 7, 2014 with English translation.

*Primary Examiner* — Joseph C Nicely
*Assistant Examiner* — Lamont Koo
(74) *Attorney, Agent, or Firm* — Rabin & Berdo, P.C.

(57) ABSTRACT

A reverse blocking IGBT is manufactured using a silicon wafer sliced from a single crystal silicon ingot which is manufactured by a floating method using a single crystal silicon ingot manufactured by a Czochralski method as a raw material. A separation layer for ensuring a reverse blocking performance of the reverse blocking IGBT is formed by diffusing impurities implanted into the silicon wafer using a thermal diffusion process. The thermal diffusion process for forming the separation layer is performed in an inert gas atmosphere at a temperature equal to or more than 1290° C. and less than the melting point of silicon. In this way, no crystal defect occurs in the silicon wafer and it is possible to prevent the occurrence of a reverse breakdown voltage defect or a forward defect in the reverse blocking IGBT and thus improve the yield of a semiconductor element.

8 Claims, 17 Drawing Sheets

(51) Int. Cl.
*C30B 33/02* (2006.01)
*H01L 29/66* (2006.01)
*H01L 21/228* (2006.01)

(58) Field of Classification Search
USPC ........................................................ 438/488
See application file for complete search history.

(56) References Cited

U.S. PATENT DOCUMENTS

| | | | |
|---|---|---|---|
| 8,476,149 | B2 | 7/2013 | Isogai et al. |
| 2003/0106482 | A1* | 6/2003 | Kononchuk ............ C30B 15/00 |
| | | | 117/13 |
| 2009/0224284 | A1* | 9/2009 | Nemoto ........................ 257/109 |
| 2010/0224968 | A1* | 9/2010 | Kurita ........................... 257/655 |
| 2011/0300697 | A1* | 12/2011 | Kohira ................ H01L 21/2254 |
| | | | 438/546 |
| 2012/0111263 | A1* | 5/2012 | Bonauer-Klepp .............. 117/38 |

FOREIGN PATENT DOCUMENTS

| | | | | |
|---|---|---|---|---|
| JP | 2607853 | | 4/1996 | |
| JP | 08-236735 | A | 9/1996 | |
| JP | 10-144945 | A | 5/1998 | |
| JP | 2975912 | | 1/1999 | |
| JP | 2002-319676 | A | 10/2002 | |
| JP | 2004-319653 | A | 11/2004 | |
| JP | 2004-336008 | A | 11/2004 | |
| JP | 2006-303410 | A | 11/2006 | |
| JP | 2010-003899 | A | 1/2010 | |
| JP | 2011-181770 | A | 9/2011 | |
| KR | 20130073350 | A | * 7/2013 | ........... H01L 31/068 |

\* cited by examiner

FIG. 4
(a) HEAT TREATMENT TEMPERATURE IS LOW OR HEAT TREATMENT TIME IS SHORT
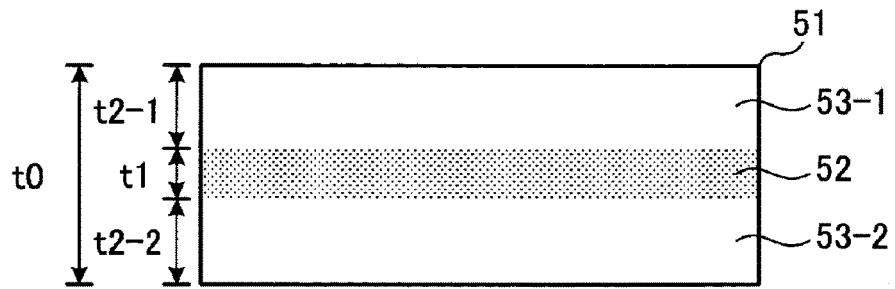
(b) HEAT TREATMENT TEMPERATURE IS HIGH OR HEAT TREATMENT TIME IS LONG
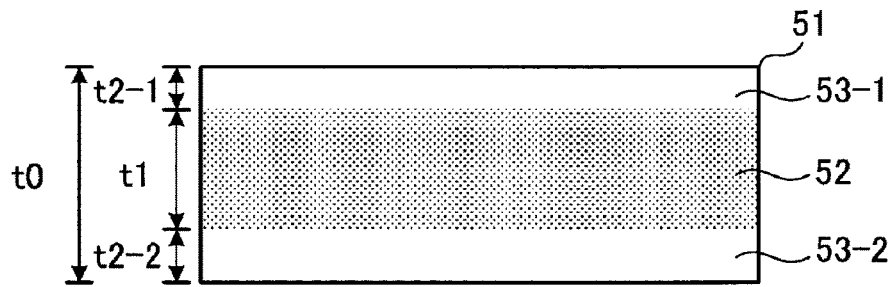

METHOD OF MANUFACTURING SEMICONDUCTOR DEVICE

TECHNICAL FIELD

The present invention relates to a method of manufacturing a semiconductor device.

BACKGROUND ART

A reverse blocking IGBT (RB-IGBT: Reverse Blocking Insulated Gate Bipolar Transistor) needs to ensure a reverse blocking performance equal to a forward blocking performance in order to guarantee a breakdown voltage even when a reverse voltage is applied. In order to ensure the reverse blocking performance, a pn junction is formed in the reverse blocking IGBT by a diffusion layer (hereinafter, referred to as a separation layer) which passes through a semiconductor chip in a direction vertical to the main surface and separates the side surface of the semiconductor chip from a drift layer. The reverse breakdown voltage of the reverse blocking semiconductor device is maintained by the pn junction.

Next, a method of manufacturing (fabricating) the reverse blocking IGBT will be described (hereinafter, referred to as a first manufacturing method). FIGS. 8 to 12 are cross-sectional views illustrating the reverse blocking IGBT according to the related art which is being manufactured and illustrate a method of diffusing a dopant from an impurity source (liquid diffusion source) which is applied onto a semiconductor wafer (application and diffusion method) to form a separation layer. First, as illustrated in FIG. 8, an oxide film 2 with a thickness of, for example, about 2.5 μm is formed on the front surface of an n-type semiconductor wafer 1 by a thermal oxidation method using a dopant mask.

Then, as illustrated in FIG. 9, the oxide film 2 is selectively removed by photolithography to form an opening 3 for forming a separation layer. Then, as illustrated in FIG. 10, a boron (B) source 4 is applied onto the oxide film 2 such that the boron source 4 is provided in the opening 3. Then, the semiconductor wafer 1 is inserted into a diffusion furnace and a thermal diffusion process is performed at a high temperature (for example, 1300° C.) for a long time (for example, 100 hours). Boron of the boron source 4 is diffused from the opening 3 of the oxide film 2 into the semiconductor wafer 1 by the thermal diffusion process to form a p-type diffusion layer, which is a separation layer 5 with a thickness of, for example, about several hundreds of micrometers, in a surface layer of the front surface of the semiconductor wafer 1.

Then, as illustrated in FIG. 11, the boron source 4 and the oxide film 2 are removed and a front surface element structure (not illustrated) of the reverse blocking IGBT is formed on the front surface of the semiconductor wafer 1. Then, the rear surface of the semiconductor wafer 1 is ground until the separation layer 5 is exposed to thin the semiconductor wafer 1. Then, as illustrated in FIG. 12, a rear surface element structure including a p$^+$ collector region 6 and a collector electrode is formed on the ground rear surface of the semiconductor wafer 1. Then, the semiconductor wafer 1 is diced into dicing chips along a dicing line (not illustrated) formed at the center of the separation layer 5. In this way, the reverse blocking IGBT having the separation layer 5 on the side surface of the chip is completed.

Next, another method of manufacturing the reverse blocking IGBT will be described (hereinafter, referred to as a second manufacturing method). FIGS. 13 to 16 are cross-sectional views illustrating another example of the reverse blocking IGBT according to the related art which is being manufactured and illustrate a method of implanting impurity ions into a semiconductor wafer and diffusing them to form a separation layer. First, as illustrated in FIG. 13, an oxide film 12 with a thickness of, for example, about 1 μm is formed on the front surface of an n-type semiconductor wafer 11 by a thermal oxidation method using a dopant mask.

Then, as illustrated in FIG. 14, the oxide film 12 is selectively removed by photolithography to form an opening 13 for forming a separation layer. Then, as illustrated in FIG. 15, boron ions 14 are implanted into the semiconductor wafer 11 using the oxide film 12 as a mask. The dose of ions 14 implanted may be, for example, about $1\times10^5$ cm$^{-2}$. Then, as illustrated in FIG. 16, the semiconductor wafer 11 is inserted into a diffusion furnace and a thermal diffusion process is performed at a high temperature (for example, 1300° C.) for a long time (for example, 100 hours). Boron implanted into the semiconductor wafer 11 is diffused by the thermal diffusion process to form a p-type diffusion layer, which is a separation layer 15 with a thickness of, for example, about several hundreds of micrometers, in a surface layer of the front surface of the semiconductor wafer 11.

Then, the oxide film 12 used for ion implantation is removed and a front surface element structure (not illustrated) of the reverse blocking IGBT is formed on the front surface of the semiconductor wafer 11. Then, similarly to the first manufacturing method described above, the rear surface of the semiconductor wafer 11 is ground until the separation layer 15 is exposed (see FIG. 11). Then, as illustrated in FIG. 12, similarly to the first manufacturing method, a p$^+$ collector region 6 and a collector electrode are formed on the ground rear surface of the semiconductor wafer 11 (represented by reference numeral 1 in FIG. 12) and the semiconductor wafer 11 is diced along a dicing line (not illustrated). In this way, the reverse blocking IGBT having the separation layer 15 (represented by reference numeral 5 in FIG. 12) on the side surface of the chip is completed.

In recent years, a method has been proposed which forms a groove in a semiconductor wafer using etching and forms a separation layer on the side wall of the groove, thereby manufacturing a reverse blocking IGBT. In addition, the following method has been proposed. A thin semiconductor wafer in which a front surface structure and a rear surface structure forming a semiconductor chip are formed is attached to a supporting substrate by a double-sided adhesive tape. A trench serving as a scribe line is formed in the thin semiconductor wafer by anisotropic wet etching such that a crystal plane is exposed. A separation layer for maintaining a reverse breakdown voltage is formed on the side surface of the trench from which the crystal plane is exposed by ion implantation and low-temperature annealing or laser annealing such that is comes into contact with a p collector region, which is a rear diffusion layer, and extends to the front surface side. Then, laser dicing is performed to clearly cut the collector electrode below the separation layer without excess or deficiency. Then, the double-sided adhesive tape peels off from the collector electrode to obtain the semiconductor chip. In this way, a reverse blocking semiconductor device is formed (for example, see U.S. Pat. No. 7,741,192).

Furthermore, as another method of manufacturing the reverse blocking IGBT, the following method has been proposed. The front surface of a thin semiconductor wafer in which a front surface structure forming a semiconductor chip is formed is attached to a supporting substrate by a double-sided adhesive tape. A trench serving as a scribe line is formed in the rear surface of the thin semiconductor wafer by anisotropic wet etching such that a crystal plane is exposed. A separation layer for maintaining a reverse breakdown voltage is formed on the side surface of the trench from which the crystal plane is exposed by ion implantation and low-temperature annealing or laser annealing at the same time as a p collector region, which is a rear diffusion layer, is formed. Then, the double-sided adhesive tape peels off from the collector electrode to obtain the semiconductor chip. In this way, a reverse blocking semiconductor device is formed (for example, see JP 2006-303410 A).

As another method of manufacturing the reverse blocking IGBT, a method has been proposed which includes: a first semiconductor region forming step of forming a second-conductivity-type first semiconductor region in a first main surface of a first-conductivity-type wafer; a front surface element structure forming step of forming a front surface element structure on the first main surface of the wafer; a concave portion forming step of forming a concave portion which extends from the second main surface of the wafer to the first semiconductor region; a second semiconductor region forming step of forming a second-conductivity-type second semiconductor region in the second main surface of the wafer so as to be electrically connected to the first semiconductor region; and a cutting step of removing a portion of the first semiconductor region and cutting the wafer into chips. In the cutting step, the first semiconductor region is removed such that the cutting plane of the first semiconductor region is inclined with reference to the first main surface of the wafer (for example, see JP 2011-181770 A).

The reverse blocking IGBT illustrated in FIG. 17 is manufactured by the techniques disclosed in U.S. Pat. No. 7,741,192; JP 2006-303410 A and JP 2011-181770 A. FIG. 17 is a cross-sectional view illustrating the structure of the reverse blocking IGBT according to the related art. As illustrated in FIG. 17, a region of a semiconductor wafer including a dicing line is removed in a groove shape by etching, thereby forming a side surface 22 of a semiconductor chip 21 forming the reverse blocking IGBT. A p$^+$ region 23 forming, for example, a breakdown voltage structure is provided in a front-side surface layer of the side surface 22 of the semiconductor chip 21.

A p$^+$ collector region 24 is formed on the rear surface of the semiconductor chip 21. A p$^+$ separation layer 25 is provided on the side surface 22 of the semiconductor chip 21 and connects the p$^+$ region 23 provided in the front surface of the semiconductor chip 21 and the p$^+$ collector region 24 provided on the rear surface of the semiconductor chip 21. When the p$^+$ separation layer 25 is formed by the techniques disclosed in U.S. Pat. No. 7,741,192; JP 2006-303410 A and JP 2011-181770 A, in many cases, a thermal diffusion process is performed at a high temperature for a long time to form the p$^+$ separation layer 25, similarly to when the separation layer is formed by the above-mentioned first and second manufacturing methods.

Furthermore, as a method of forming the separation layer, a method has been proposed which includes: a first diffusion step of performing deposition on a wafer surface with a wafer plane orientation (111) or (100) in an impurity atmosphere, for a wafer which is sliced with a predetermined thickness from a silicon single crystal ingot having a crystal axis <111> or <100> and whose both surfaces are simultaneously lapped with an abrasive so as to have a uniform processing strain; and a second diffusion step of processing the wafer subjected to the first diffusion step at a temperature of 1250° C. to 1310° C. for 20 hours to 450 hours in a mixed gas atmosphere including 0.5 to 10 (vol) % of O$_2$ gas and Ar or He such that a layer in which no impurity diffused is formed at the center of the wafer and layers in which impurities are diffused are formed on both surfaces of the wafer (for example, see JP 2607853 B1).

As another method of forming the separation layer, a semiconductor silicon wafer manufacturing method has been proposed which includes a first diffusion step of shallowly depositing N impurities on both surfaces of a lapped silicon semiconductor wafer; and a second diffusion step of performing a heat treatment on the wafer at a high temperature for a long time to obtain a necessary diffusion depth and concentration in the surface of the wafer. In the first diffusion step, a diffusion source of N impurities in the wafer is phosphorous in phosphorous oxychloride, phosphorous oxychloride vapor is continuously supplied together with Ar gas including 0.5% or more of O$_2$ gas, the temperature is maintained in the range of 1100° C. to 1300° C., and diffusion is performed for a predetermined time such that a target diffusion depth and a target wafer surface concentration are obtained after the second diffusion step (for example, see JP 2975912 B1).

As a method of forming the separation layer without performing a thermal diffusion process at a high temperature for a long time, a method has been proposed which forms a trench in the front surface of a semiconductor wafer using etching, forms a diffusion layer serving as a separation layer on the bottom and side wall of the trench, and leaves the diffusion layer on the side wall of the trench as the separation layer (hereinafter, referred to as a third manufacturing method).

DISCLOSURE OF THE INVENTION

Problem to be Solved by the Invention

However, in the third manufacturing method, the thermal diffusion process is not performed at a high temperature for a long time in order to form the separation layer, but it takes a long time to form the trench for forming the separation layer. When a trench with a depth of about 200 μm is formed by a typical dry etching apparatus, the time required to form the trench per semiconductor wafer is about 100 minutes. Therefore, the lead time increases or the number of times the etching apparatus is maintained increases.

As in the techniques disclosed in U.S. Pat. No. 7,741,192; JP 2006-303410 A; JP 2011-181770 A; JP 2607853 B1 and JP 2975912 B1, when the thermal diffusion process is performed at a high temperature for a long time in order to form the separation layer, a crystal defect occurs in the semiconductor wafer due to components forming the semiconductor wafer or components included in the atmosphere during the thermal diffusion process. This causes a reduction in the yield of a semiconductor element.

The invention has been made in view of the above-mentioned problems and an object of the invention is to provide a method of manufacturing a semiconductor device with high yield.

Means for Solving Problem

In order to solve the problems and achieve the object of the invention, according to an aspect of the invention, there is provided a method of manufacturing a semiconductor device including performing a heat treatment in an inert gas atmosphere at a temperature equal to or more than 1290° C.

and less than a melting point of silicon for a silicon wafer which is manufactured by a floating method using a single crystal silicon ingot manufactured by a Czochralski method as a raw material or a silicon wafer which is manufactured by the floating method using a polycrystalline silicon ingot as a raw material.

In the method of manufacturing a semiconductor device according to the above-mentioned aspect of the invention, the inert gas atmosphere may be a gas atmosphere including argon as a main component.

In the method of manufacturing a semiconductor device according to the above-mentioned aspect of the invention, the heat treatment may be performed at a temperature equal to or more than 1300° C. and equal to or less than 1350° C.

In the method of manufacturing a semiconductor device according to the above-mentioned aspect of the invention, the silicon wafer which is manufactured by the floating method using the polycrystalline silicon ingot as the raw material may be used, the inert gas atmosphere may be a nitrogen atmosphere, and the heat treatment may be performed at a temperature equal to or more than 1290° C. and less than the melting point of silicon. The heat treatment may be performed at a temperature equal to or more than 1290° C. and equal to or less than 1350° C.

According to the above-mentioned aspect of the invention, it is possible to perform a heat treatment at a high temperature for a long time such that a crystal defect does not occur in the silicon wafer manufactured by the FZ method. Therefore, it is possible to manufacture a semiconductor device using a heat treatment which is performed at a high temperature for a long time, without any crystal defect in the silicon wafer. In this way, it is possible to prevent the occurrence of a reverse breakdown voltage defect or a forward defect in the reverse blocking IGBT.

In order to solve the above-mentioned problems and achieve the object of the invention, according to another aspect of the invention, there is provided a method of manufacturing a semiconductor device including: a heat treatment step of performing a heat treatment in a nitrogen atmosphere at a temperature equal to or more than 1290° C. and less than a melting point of silicon for a silicon wafer which is manufactured by a floating method using a single crystal silicon ingot manufactured by a Czochralski method as a raw material; and a grinding step of grinding one main surface of the silicon wafer until a region including a crystal defect which occurs in the silicon wafer due to the heat treatment step is removed.

According to the above-mentioned aspect of the invention, the heat treatment is performed on the silicon wafer manufactured by the FZ method at a high temperature for a long time in the nitrogen atmosphere. Therefore, even when a crystal defect occurs, it is possible to manufacture a semiconductor device so as not to include the crystal defect which occurs in the silicon wafer. In this way, it is possible to prevent the occurrence of a reverse breakdown voltage defect or a forward defect in the reverse blocking IGBT.

The method of manufacturing a semiconductor device according to the above-mentioned aspect of the invention may further include a diffusion step of diffusing a second-conductivity-type diffusion layer which forms a pn junction with the silicon wafer, which is a first-conductivity-type drift layer of a reverse blocking insulated gate bipolar transistor, from one main surface to the other main surface of the silicon wafer using the heat treatment. In the diffusion step, the second-conductivity-type diffusion layer may be diffused so as to reach a second-conductivity-type collector region which is formed in the other main surface of the silicon wafer before or after the diffusion step.

According to the above-mentioned aspect of the invention, it is possible to manufacture a semiconductor device using a silicon wafer which is manufactured by the floating method using a polycrystalline silicon ingot as a raw material, or a silicon wafer which is manufactured by the floating method using a single crystal silicon ingot manufactured by the Czochralski method as a raw material and has the same quality characteristics as the silicon wafer manufactured by the floating method using the polycrystalline silicon ingot as a raw material.

In addition, according to the above-mentioned aspect of the invention, it is possible to manufacture a semiconductor device using the silicon wafer which is manufactured by the floating method using the single crystal silicon ingot manufactured by the Czochralski method as a raw material and whose diameter can be easily increased, which is the feature of the single crystal silicon ingot manufactured by the Czochralski method.

Advantageous Effects of Invention

According to the method of manufacturing the semiconductor device of the invention, it is possible to improve yield.

BRIEF DESCRIPTION OF DRAWINGS

FIG. 4 is a cross-sectional view illustrating a situation in which a crystal defect occurs in the semiconductor wafer.

BEST MODE(S) FOR CARRYING OUT THE INVENTION

Figure 1:
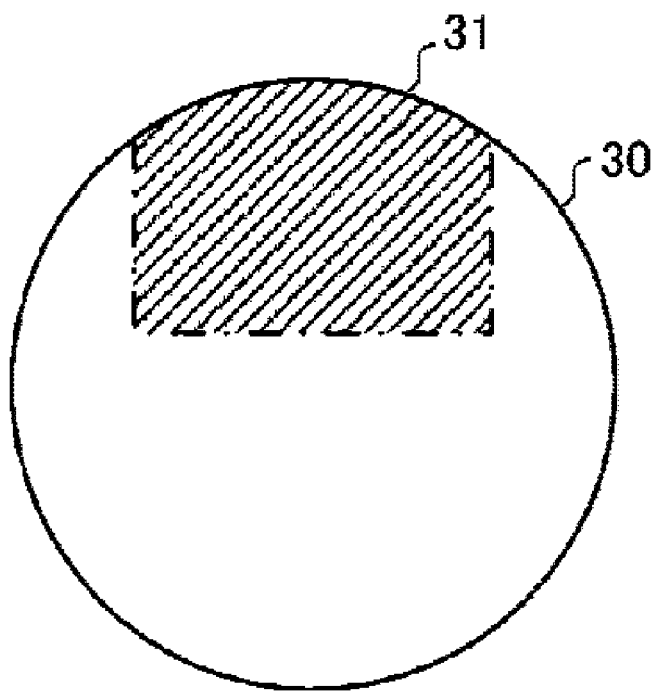
FIG. 1 is a plan view illustrating a position where the X-ray topographic image of a semiconductor wafer is captured.

Hereinafter, methods of manufacturing semiconductor devices according to exemplary embodiments of the invention will be described in detail with reference to the accompanying drawings. In the specification and the accompanying drawings, in the layers or regions having "n" or "p" appended thereto, an electron or a hole is a major carrier. In addition, symbols "+" and "−" added to n or p mean that impurity concentration is higher and lower than that of the layer or the region without the symbols. In the description of the following embodiments and the accompanying drawings, the same components are denoted by the same reference numerals and the description thereof will not be repeated.

(First Embodiment)

A semiconductor device according to a first embodiment is manufactured using a semiconductor wafer (hereinafter, referred to as an FZ wafer obtained from a crystal rod manufactured by a Czochralski (CZ) method) which is cut (sliced) from a single crystal silicon ingot (hereinafter, referred to as an FZ ingot) manufactured by a floating zone (FZ) method using a single crystal silicon ingot (hereinafter, referred to as a CZ ingot) manufactured by the CZ method as a raw material.

For example, the FZ wafer obtained from the crystal rod manufactured by the CZ method is manufactured as follows. First, one end of the CZ ingot manufactured using polycrystalline silicon which is roughly crushed as a raw material comes into contact with a seed crystal. Then, a high-frequency voltage is applied to a coil to heat and melt the CZ ingot into a strip shape and the molten strip-shaped portion is moved to the seed crystal to manufacture the FZ ingot. Then, the FZ ingot is sliced. In this way, the FZ wafer obtained from the crystal rod manufactured by the CZ method is completed.

In each process of manufacturing the semiconductor device according to the first embodiment, a heat treatment is performed at a high temperature for a long time in an inert gas atmosphere. For example, in the case of a reverse blocking IGBT illustrated in FIG. 12, the heat treatment in each process of manufacturing the semiconductor device according to the first embodiment means a thermal diffusion process for forming a separation layer 5 for maintaining a reverse breakdown voltage, a thermal annealing process for forming an electrode, or the like. The term "long time" means, for example, the time required to form the separation layer 5 with a desired depth.

Specifically, for example, it is preferable that the heat treatment be performed at a temperature equal to or greater than 1290° C. and less than the melting point (1410° C.) of silicon for, for example, 100 hours or less in an inert gas atmosphere, that is, a gas atmosphere including argon (Ar), helium (He), or the like as a main component (hereinafter, referred to as heat treatment conditions according to the first embodiment). The reason will be described below. For example, when the thermal diffusion process for forming the separation layer 5 is performed under the heat treatment conditions according to the first embodiment, it is possible to form the separation layer 5 with a depth equal to the thickness of an FZ wafer 1 which is obtained from the crystal rod manufactured by the CZ method in the completed reverse blocking IGBT, without reducing the yield of a semiconductor element.

Figure 8:
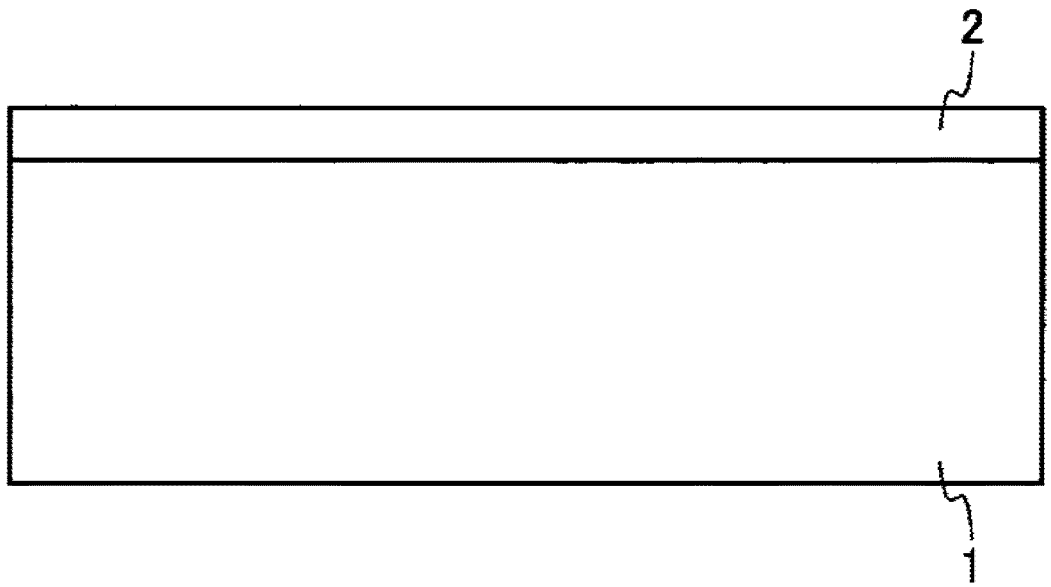
FIG. 8 is a cross-sectional view illustrating a reverse blocking IGBT according to the related art which is being manufactured.
Figure 9:
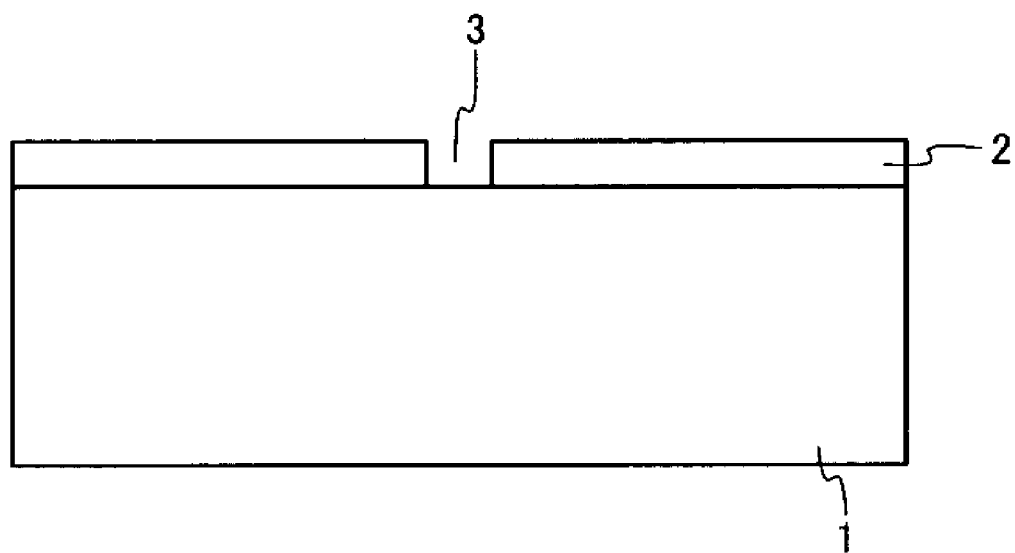
FIG. 9 is a cross-sectional view illustrating the reverse blocking IGBT according to the related art which is being manufactured.
Figure 10:
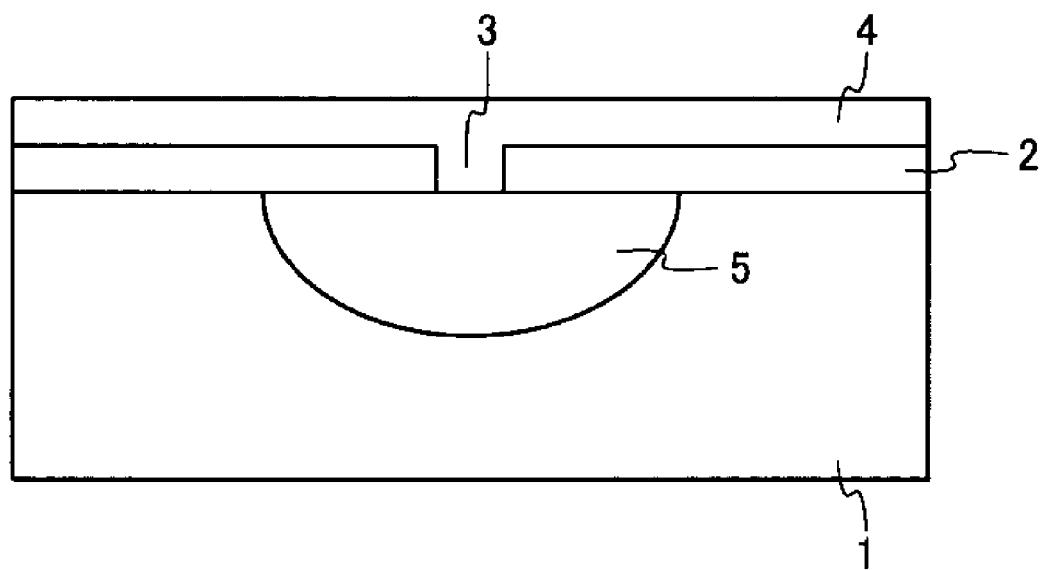
FIG. 10 is a cross-sectional view illustrating the reverse blocking IGBT according to the related art which is being manufactured.

Next, for a method of manufacturing the semiconductor device according to the first embodiment, for example, the manufacture of the reverse blocking IGBT by the first manufacturing method (see FIGS. 8 to 12) will be described. First, an FZ wafer obtained from the crystal rod manufactured by the CZ method is prepared as the semiconductor wafer 1 illustrated in FIG. 8 (hereinafter, referred to as the FZ wafer 1 obtained from the crystal rod manufactured by the CZ method). Next, as illustrated in FIGS. 8 to 10, a process of applying a boron source 4 onto the FZ wafer 1 obtained from the crystal rod manufactured by the CZ method using an oxide film 2 as a dopant mask is performed.

Figure 11:
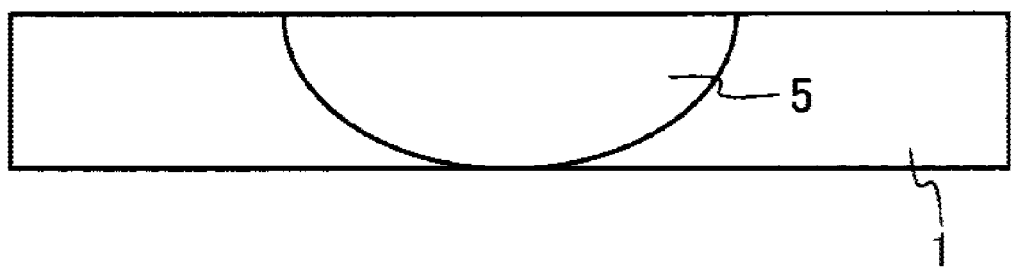
FIG. 11 is a cross-sectional view illustrating the reverse blocking IGBT according to the related art which is being manufactured.

Then, the FZ wafer 1 obtained from the crystal rod manufactured by the CZ method is inserted into a diffusion furnace and the thermal diffusion process is performed under the heat treatment conditions according to the first embodiment described above. Boron of the boron source 4 is diffused into the FZ wafer 1 obtained from the crystal rod manufactured by the CZ method through an opening 3 of the oxide film 2 by the thermal diffusion process to form a p-type diffusion layer, which is the separation layer 5, in a surface layer of the front surface of the FZ wafer 1 obtained from the crystal rod manufactured by the CZ method. The depth of the separation layer 5 is in the range of 100 µm to 150 µm at a voltage class of 600 V. In this case, the depth of the separation layer 5 is 120 µm. Then, as illustrated in FIG. 11, the boron source 4 and the oxide film 2 are removed and a front surface element structure (not illustrated) of the reverse blocking IGBT is formed on the front surface side of the FZ wafer 1 obtained from the crystal rod manufactured by the CZ method.

Figure 12:
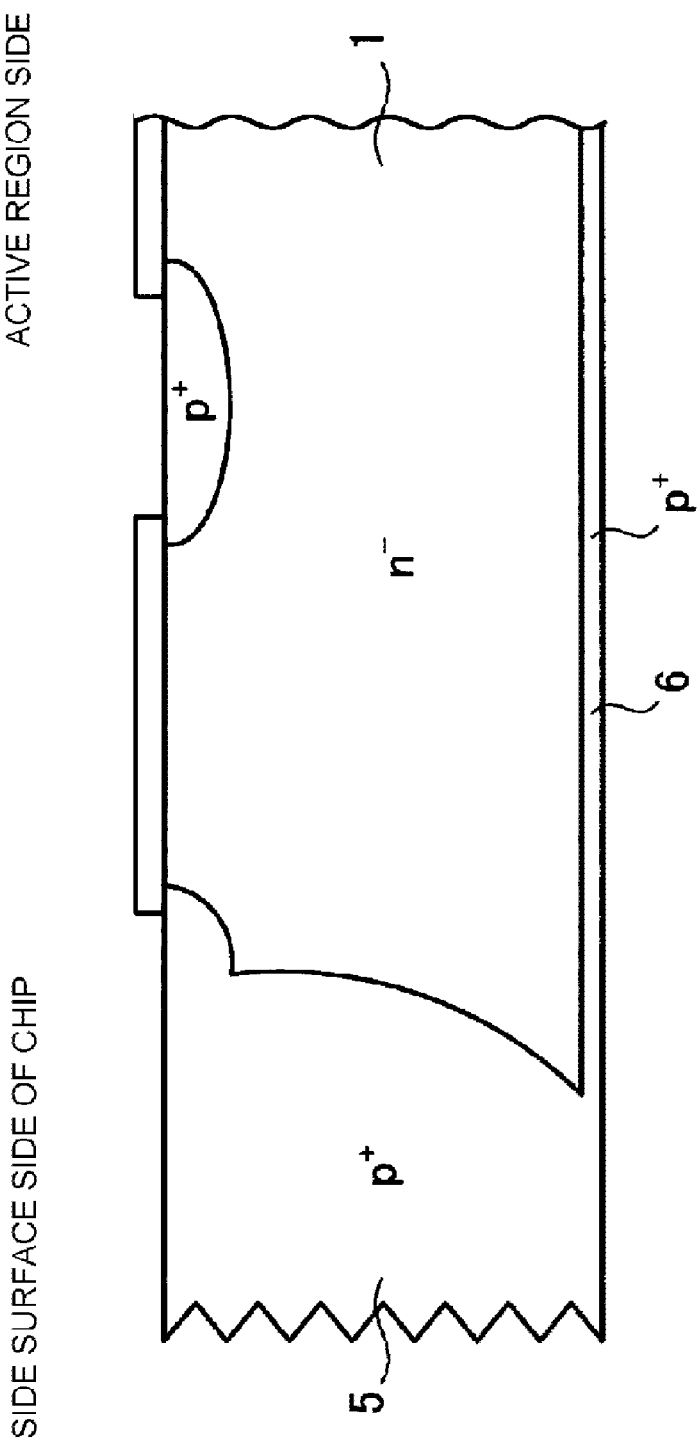
FIG. 12 is a cross-sectional view illustrating the reverse blocking IGBT according to the related art which is being manufactured.
Figure 13:
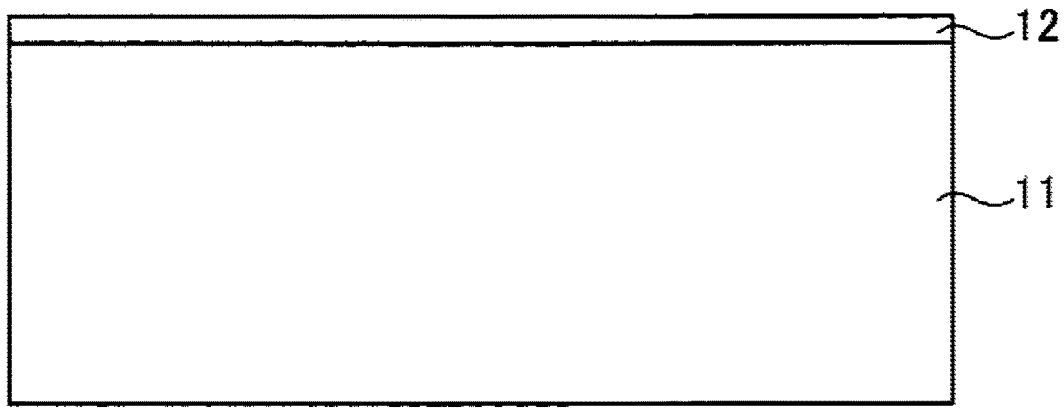
FIG. 13 is a cross-sectional view illustrating another example of the reverse blocking IGBT according to the related art which is being manufactured.
Figure 14:
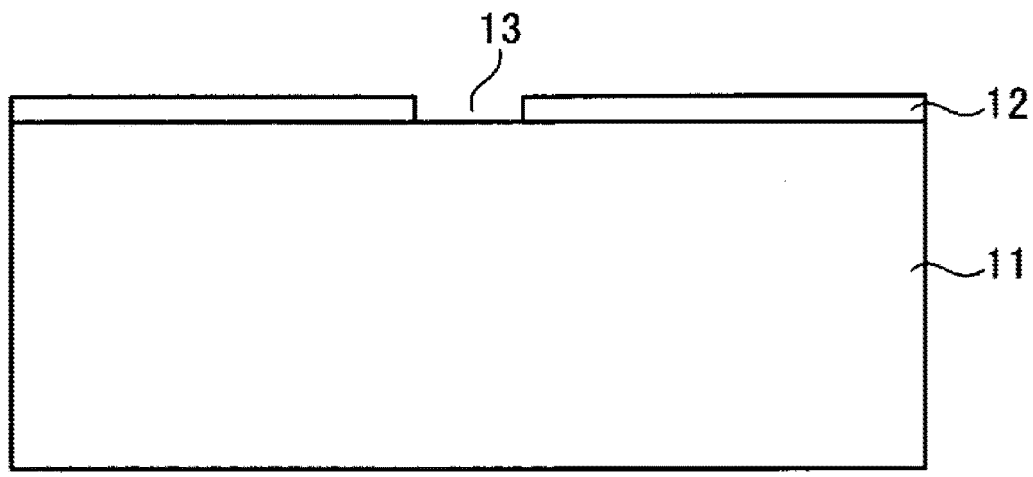
FIG. 14 is a cross-sectional view illustrating another example of the reverse blocking IGBT according to the related art which is being manufactured.
Figure 15:
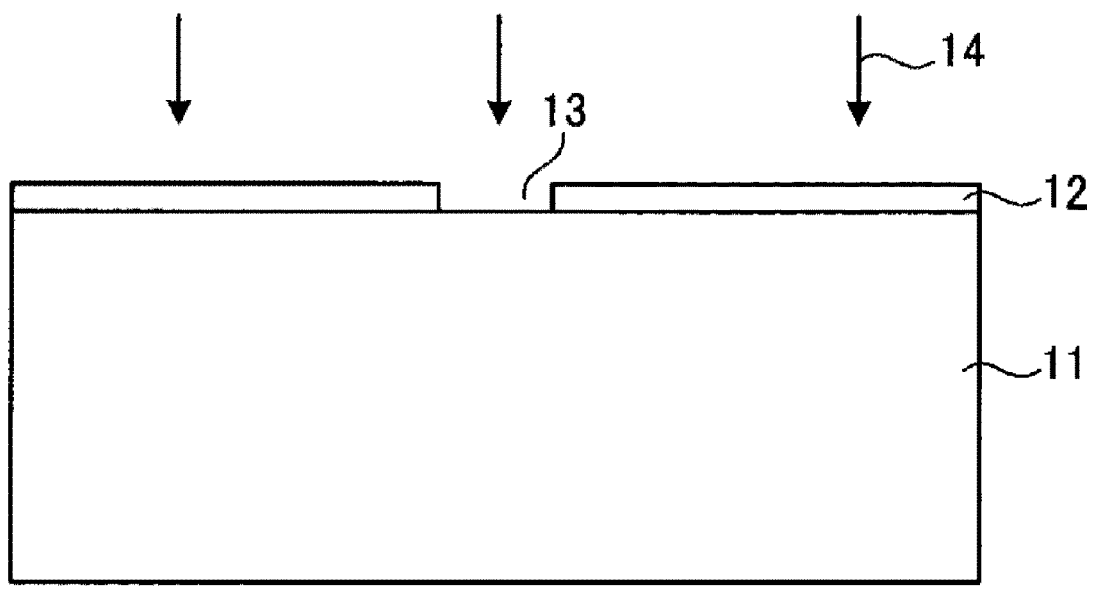
FIG. 15 is a cross-sectional view illustrating another example of the reverse blocking IGBT according to the related art which is being manufactured.
Figure 16:
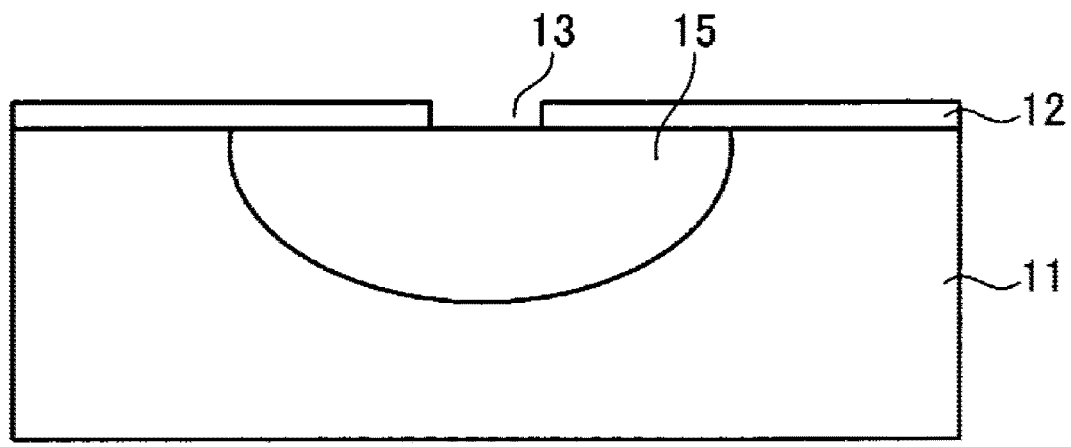
FIG. 16 is a cross-sectional view illustrating another example of the reverse blocking IGBT according to the related art which is being manufactured.
Figure 17:
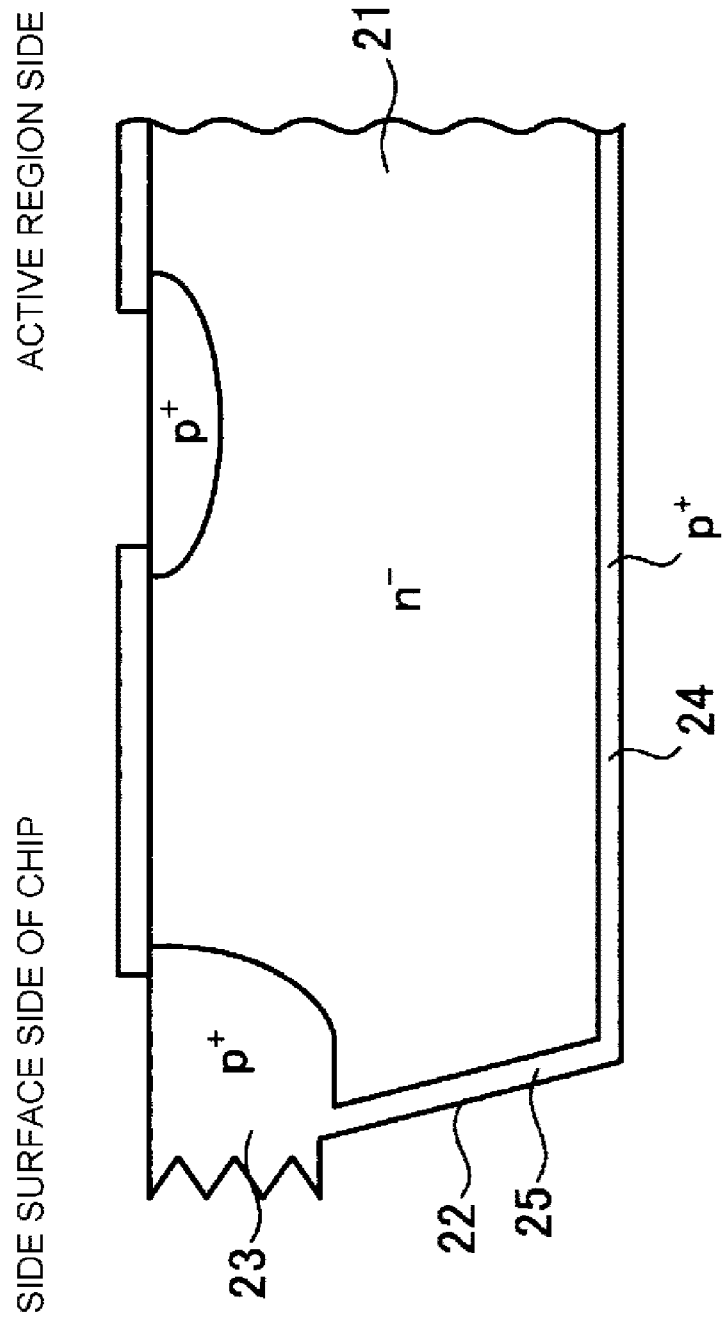
FIG. 17 is a cross-sectional view illustrating the structure of the reverse blocking IGBT according to the related art.

Then, a rear surface of the FZ wafer 1 obtained from the crystal rod manufactured by the CZ method is ground until the separation layer 5 is exposed, thereby thinning the FZ wafer 1 obtained from the crystal rod manufactured by the CZ method. Then, as illustrated in FIG. 12, a rear surface element structure including a $p^+$ collector region 6 and a collector electrode is formed on the ground rear surface of the FZ wafer 1 obtained from the crystal rod manufactured by the CZ method. Then, the FZ wafer 1 obtained from the crystal rod manufactured by the CZ method is diced into chips along a dicing line (not illustrated) which is formed at the center of the separation layer 5. In this way, the reverse blocking IGBT including the separation layer 5 on the side surface of the chip is completed.

In the method of manufacturing the semiconductor device according to the first embodiment, the first manufacturing method is used. However, the invention is not limited thereto, but can be changed in various ways. For example, the heat treatment in each process of manufacturing the semiconductor device according to the first embodiment described above may be performed under the heat treatment conditions according to the first embodiment, or other manufacturing methods, such as the second manufacturing method (see FIGS. 12 to 17), may be selected.

Next, the internal state of a crystal of the FZ wafer (hereinafter, referred to as a first example) obtained from the crystal rod manufactured by the CZ method, which has been subjected to the heat treatment under the heat treatment conditions according to the first embodiment, will be described. First, the heat treatment was performed on the FZ wafer obtained from the crystal rod manufactured by the CZ method under the heat treatment conditions according to the first embodiment to manufacture the FZ wafer obtained from the crystal rod manufactured by the CZ method according to the first example. Specifically, the heat treatment is performed on the FZ wafer obtained from the crystal rod manufactured by the CZ method according to the first example at a temperature of 1300° C. for 100 hours in an argon atmosphere including 30% of oxygen ($O_2$) and 70% of argon. A furnace input temperature (temperature when the semiconductor wafer was inserted into the heating furnace) and a furnace output temperature (temperature when the semiconductor wafer was taken out from the heating furnace) were 700° C. The rate of temperature increase or decrease of the surface of the semiconductor wafer was 1° C./min When the heat treatment was performed at a temperature of 1300° C. for 100 hours in an argon atmosphere including 20% of oxygen ($O_2$) and 80% of argon and when the heat treatment was performed at a temperature of 1300° C. for 100 hours in an argon atmosphere including 15% of oxygen ($O_2$) and 85% of argon, the same result as that when the heat treatment was performed at a temperature of 1300° C. for 100 hours in an argon atmosphere including 30% of oxygen ($O_2$) and 70% of argon was obtained.

For comparison, an FZ wafer (hereinafter, referred to as a first comparative example) obtained from the crystal rod manufactured by the CZ method which was subjected to a heat treatment at a high temperature for a long time in a nitrogen atmosphere and an FZ wafer (hereinafter, referred to as a second comparative example) according to the related art which was subjected to a heat treatment at a high temperature for a long time in a nitrogen atmosphere were manufactured. The FZ wafer according to the related art is a semiconductor wafer (hereinafter, referred to as an FZ wafer manufactured using polycrystalline silicon as a raw material) sliced from an FZ ingot which is manufactured using a polycrystalline silicon (poly-Si) ingot as a raw material.

Specifically, the heat treatment is performed on the FZ wafer obtained from the crystal rod manufactured by the CZ method according to the first comparative example and the FZ wafer manufactured using polycrystalline silicon as a raw material according to the second comparative example at a temperature of 1300° C. for 100 hours in a nitrogen atmosphere including 30% of oxygen ($O_2$) and 70% of nitrogen ($N_2$). The furnace input temperature, the furnace output temperature, and the rate of temperature increase or decrease of the surface of the semiconductor wafer are the same as those in the heat treatment for the FZ wafer obtained from the crystal rod manufactured by the CZ method according to the first example. In addition, when the heat treatment was performed at a temperature of 1300° C. for 100 hours in a nitrogen atmosphere including 20% of oxygen ($O_2$) and 80% of nitrogen ($N_2$) and when the heat treatment was performed at a temperature of 1300° C. for 100 hours in a nitrogen atmosphere including 15% of oxygen ($O_2$) and 80% of nitrogen ($N_2$), the same result as that when the heat treatment was performed at a temperature of 1300° C. for 100 hours in a nitrogen atmosphere including 30% of oxygen ($O_2$) and 70% of nitrogen ($N_2$) was obtained.

The X-ray topographic images of three samples, that is, the FZ wafer obtained from the crystal rod manufactured by the CZ method according to the first example, the FZ wafer obtained from the crystal rod manufactured by the CZ method according to the first comparative example, and the FZ wafer manufactured using polycrystalline silicon as a raw material according to the second comparative example were captured and the internal state of a crystal of each sample was observed. FIG. 1 is a plan view illustrating the position where the X-ray topographic image of the semiconductor wafer is captured. As illustrated in FIG. 1, the X-ray topographic images of the three samples were captured in the vicinity 31 of the outer circumference of a semiconductor wafer 30.

Figure 2:
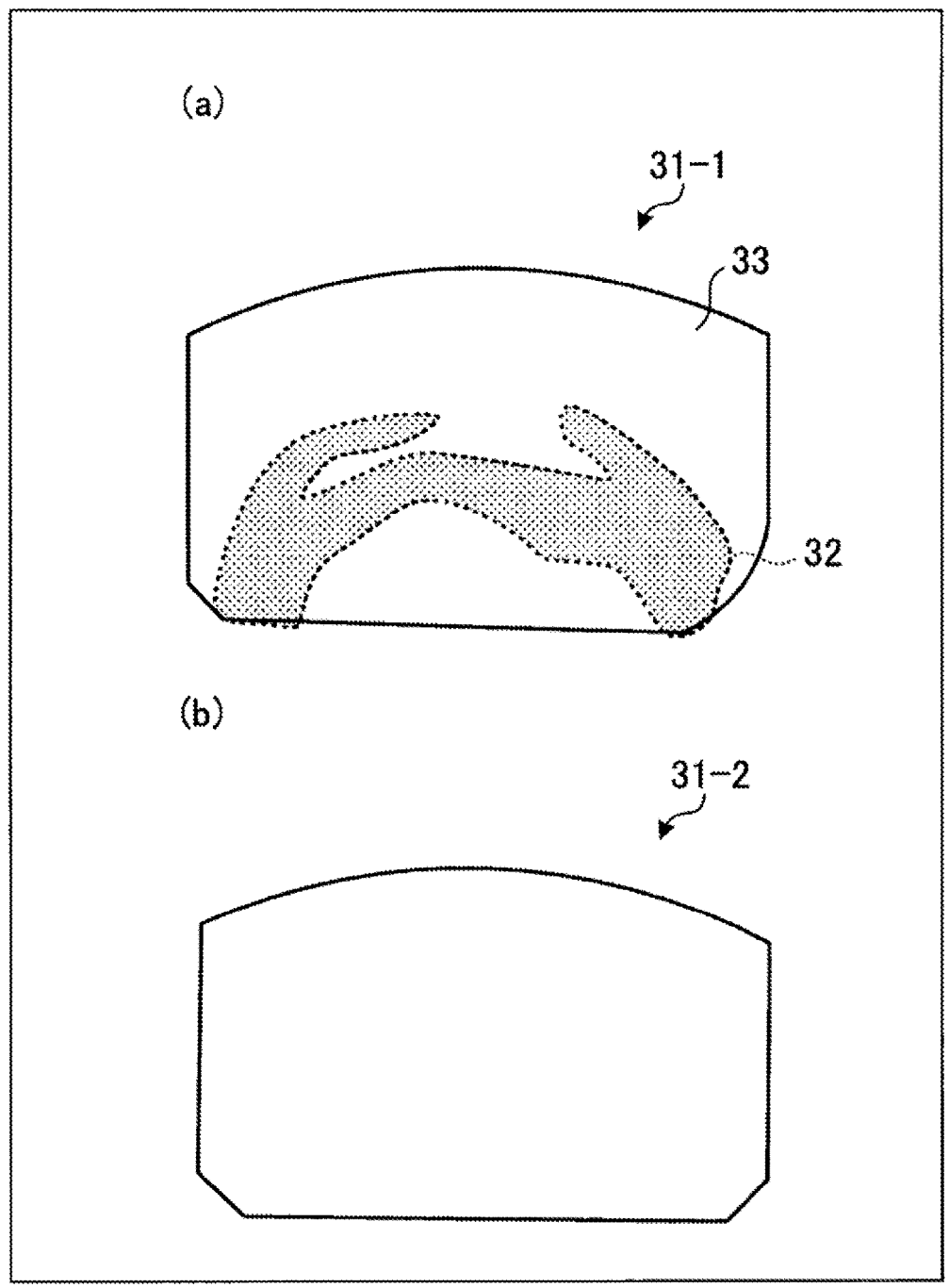
FIG. 2 is a plan view schematically illustrating the X-ray topographic image of the semiconductor wafer subjected to a heat treatment in a nitrogen atmosphere.

FIG. 2 is a plan view schematically illustrating the X-ray topographic image of the semiconductor wafer subjected to the heat treatment in a nitrogen atmosphere. FIGS. 2(a) and 2(b) schematically illustrate the captured X-ray topographic images of the FZ wafer obtained from the crystal rod manufactured by the CZ method according to the first comparative example and the FZ wafer manufactured using polycrystalline silicon as a raw material according to the second comparative example. As illustrated in FIG. 2(a), it was confirmed that a precipitate was generated and a ring-shape crystal defect 32 occurred in an FZ wafer 31-1 obtained from the crystal rod manufactured by the CZ method according to the first comparative example.

The inventors found that the precipitate generated in the FZ wafer obtained from the crystal rod manufactured by the CZ method according to the first comparative example was mainly a nitride with an α-$Si_3N_4$ crystal structure using EDX (Energy Dispersive X-ray spectroscopy) analysis and electron beam diffraction image analysis.

The reason why the crystal defect occurs in the FZ wafer obtained from the crystal rod manufactured by the CZ method according to the first comparative example is presumed as follows. The inventors found that the FZ wafer obtained from the crystal rod manufactured by the CZ method before a heat treatment had substantially the same quality characteristics as the FZ wafer manufactured using polycrystalline silicon as a raw material. Even when the FZ ingot is manufactured using the CZ ingot as a raw material, there is no heat history in the FZ ingot during the manufacture process of the CZ ingot when the FZ method is applied to the CZ ingot.

Therefore, the FZ ingot manufactured using the CZ ingot as a raw material has the same quality characteristics as the FZ ingot manufactured using a poly-Si ingot as a raw material. However, the CZ ingot includes a larger amount of impurity, such as oxygen, boron (B), or phosphorous (P), than the poly-Si ingot. Therefore, a point defect caused by a hole or an interstitial atom is likely to occur in the FZ ingot manufactured using the CZ ingot as a raw material.

When the heat treatment is performed on the FZ wafer obtained from the crystal rod manufactured by the CZ method which is sliced from the FZ ingot with the point defect at a high temperature for a long time in a nitrogen atmosphere, nitrogen beyond a solubility limit ($4 \times 10^{15}$ atoms/cm$^3$) is inserted around the point defect in the FZ wafer obtained from the crystal rod manufactured by the CZ method and is bonded to silicon to form a nitrogen precipitate. Then, a crystal defect occurs in the FZ wafer obtained from the crystal rod manufactured by the CZ method due to the nitrogen precipitate.

As illustrated in FIG. 2(b), no crystal defect occurred in an FZ wafer 31-2 manufactured using polycrystalline silicon as a raw material according to the second comparative example. The reason is presumed as follows. Since the amount of impurity included in the poly-Si ingot is less than that of impurity included in the CZ ingot, the point defect caused by a hole or an interstitial atom is less likely to occur in the FZ ingot manufactured using the poly-Si ingot as a raw material. Since there is little point defect in the FZ wafer manufactured using polycrystalline silicon as a raw material, which is obtained from the FZ ingot manufactured using a poly-Si ingot as a raw material, nitrogen is hardly inserted into the FZ wafer manufactured using polycrystalline silicon as a raw material. Even when nitrogen is inserted into the FZ wafer manufactured using polycrystalline silicon as a raw material, the overall amount of impurity in the FZ wafer manufactured using polycrystalline silicon as a raw material is small.

No crystal defect occurred in the FZ wafer obtained from the crystal rod manufactured by the CZ method according to the first example, similarly to the FZ wafer manufactured using polycrystalline silicon as a raw material according to the second comparative example illustrated in FIG. 2(b). Accordingly, it was confirmed that the FZ wafer obtained from the crystal rod manufactured by the CZ method according to the first example had the same quality characteristics as the FZ wafer manufactured using polycrystalline silicon as a raw material. Therefore, the FZ wafer obtained from the crystal rod manufactured by the CZ method has the same quality characteristics as the FZ wafer manufactured using polycrystalline silicon as a raw material and it is easy to increase the diameter of the FZ wafer, which is the feature of the CZ ingot.

The reason why no crystal defect occurs in the FZ wafer obtained from the crystal rod manufactured by the CZ method according to the first example is presumed as follows. Since the heat treatment is performed in an inert gas atmosphere, such as an argon atmosphere, there is no nitrogen in the atmosphere and nitrogen is not inserted into the FZ wafer obtained from the crystal rod manufactured by the CZ method even when the heat treatment is performed at a high temperature for a long time. Therefore, the heat treatment can be performed at a high temperature for a long time to form the separation layer 5 of the reverse blocking IGBT illustrated in FIG. 12 for a thermal diffusion time shorter than that in the related art.

Figure 3:
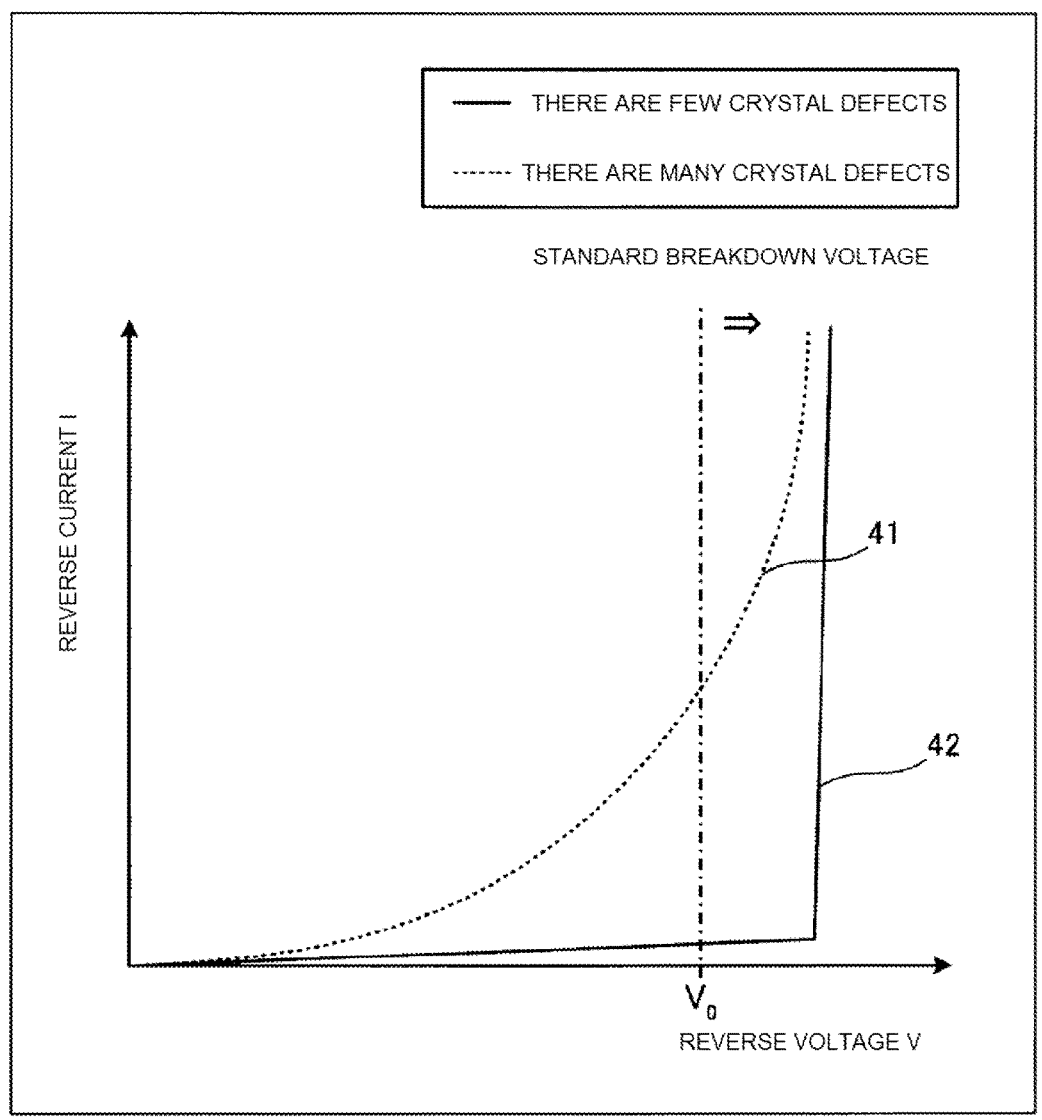
FIG. 3 is a characteristic diagram illustrating the reverse breakdown voltage characteristics of a semiconductor device according to a first embodiment.

Next, the reverse breakdown voltage characteristics of the semiconductor device according to the first embodiment were verified. FIG. 3 is a characteristic diagram illustrating the reverse breakdown voltage characteristics of the semiconductor device according to the first embodiment. First, a reverse blocking IGBT was manufactured by the first manufacturing method (FIGS. 8 to 12) as the method of manufacturing the semiconductor device according to the first embodiment (hereinafter, referred to as a reverse blocking IGBT according to the first example). That is, the thermal diffusion process for forming the separation layer 5 of the reverse blocking IGBT according to the first example is performed under the same heat treatment conditions as those in the heat treatment for the FZ wafer obtained from the crystal rod manufactured by the CZ method according to the first example. A dopant for forming the separation layer 5 was boron.

For comparison, a reverse blocking IGBT (hereinafter, referred to as a reverse blocking IGBT according to the first comparative example) subjected to the thermal diffusion process for forming the separation layer under the same heat treatment conditions as those in the heat treatment for the FZ wafer obtained from the crystal rod manufactured by the CZ method according to the first comparative example was manufactured. A method of manufacturing the reverse blocking IGBT according to the first comparative example is similar to the method of manufacturing the reverse blocking IGBT according to the first example except for the heat treatment conditions.

Then, a variation in a reverse current I (reverse breakdown voltage characteristics) with the application of a reverse voltage V was measured for each of the reverse blocking IGBT according to the first example and the reverse blocking IGBT according to the first comparative example. The reverse voltage V is a voltage applied to the emitter on the basis of the potential of the collector. For the reverse blocking IGBT according to the first comparative example, for example, a ring-shape crystal defect 32 occurs in the FZ wafer obtained from the crystal rod manufactured by the CZ method due to the thermal diffusion process for forming the separation layer, as illustrated in FIG. 2(a). Therefore, a reverse blocking IGBT with many crystal defects and a reverse blocking IGBT with few crystal defects are manufactured on the surface of one FZ wafer obtained from the crystal rod manufactured by the CZ method. The reverse breakdown voltage characteristics of each of the reverse blocking IGBT with many crystal defects and the reverse blocking IGBT with few crystal defects were measured.

The reverse blocking IGBT with many crystal defects is a reverse blocking IGBT according to the first comparative example which includes a region of the FZ wafer obtained from the crystal rod manufactured by the CZ method in which the crystal defect 32 occurs due to the heat treatment or the thermal diffusion process for manufacturing the reverse blocking IGBT according to the first comparative example. The reverse blocking IGBT with few crystal defects is a reverse blocking IGBT according to the first comparative example which does not include the region of the FZ wafer obtained from the crystal rod manufactured by the CZ method in which the crystal defect 32 occurs due to the heat treatment or the thermal diffusion process for manufacturing the reverse blocking IGBT according to the first comparative example. FIG. 3 illustrates the breakdown voltage characteristics 41 of the reverse blocking IGBT with many crystal defects according to the first comparative example and the breakdown voltage characteristics 42 of the reverse blocking IGBT with few crystal defects according to the first comparative example.

As can be seen from the breakdown voltage characteristics 41 of FIG. 3, in the reverse blocking IGBT with many crystal defects according to the first comparative example, before the reverse voltage V reached a standard breakdown voltage $V_0$, the value of the reverse current I increased and a large amount of reverse leakage current flowed. Therefore, as the crystal defects in the semiconductor chip increased, the reverse breakdown voltage characteristics become worse. Although not illustrated in the drawings, in the reverse blocking IGBT with many crystal defects according to the first comparative example, as the crystal defects in the semiconductor chip increased, forward breakdown voltage characteristics also become worse.

As illustrated in the breakdown voltage characteristics 41 of the reverse blocking IGBT with many crystal defects according to the first comparative example illustrated in FIG. 3, when the amount of reverse leakage current for the value of the standard breakdown voltage $V_0$ is large, the element is defective. One FZ wafer obtained from the crystal rod manufactured by the CZ method is cut into a plurality of semiconductor chips. Therefore, for example, as illustrated in FIG. 2(a), a region of the FZ wafer obtained from the crystal rod manufactured by the CZ method in which the crystal defect 32 occurs is also cut into a plurality of semiconductor chips. All of the reverse blocking IGBTs provided in the semiconductor chips cut from the region in which the crystal defect 32 occurs in the surface of one FZ wafer obtained from the crystal rod manufactured by the CZ method are defective. Therefore, the yield of the reverse blocking IGBT depends on the range of the region in which the crystal defect 32 occurs. For example, it was confirmed that the yield of the reverse blocking IGBT according to the first comparative example which was manufactured from one FZ wafer obtained from the crystal rod manufactured by the CZ method was in the range of about 40% to 50%.

On the other hand, as can be seen from the breakdown voltage characteristics 42 of FIG. 3, in the reverse blocking IGBT with few crystal defects according to the first comparative example, the value of the reverse current I was small in the range in which the reverse voltage V is lower than the standard breakdown voltage $V_0$ and little reverse leakage current was generated.

It was confirmed that the reverse blocking IGBT according to the first example had the same good breakdown voltage characteristics as the breakdown voltage characteristics 42 of the reverse blocking IGBT with few crystal defects according to the first comparative example. The reason why no crystal defect occurs in the reverse blocking IGBT according to the first example is that the thermal diffusion process is performed at a high temperature for a long time in an argon atmosphere and no crystal defect occurs, similarly to the FZ wafer obtained from the crystal rod manufactured by the CZ method according to the first example. As such, since no crystal defect occurs during the manufacture of the reverse blocking IGBT according to the first example, the yield of the reverse blocking IGBT according to the first example which is manufactured from one FZ wafer obtained from the crystal rod manufactured by the CZ method is approximately 100%.

Therefore, the heat treatment is performed on the FZ wafer obtained from the crystal rod manufactured by the CZ method under the heat treatment conditions according to the first embodiment such that no crystal defect occurs in the FZ wafer obtained from the crystal rod manufactured by the CZ method. In this way, it is possible to prevent the occurrence of a reverse breakdown voltage defect or a forward defect in a semiconductor element which is manufactured using the FZ wafer obtained from the crystal rod manufactured by the CZ method and thus improve the yield of the semiconductor element.

The reason why the heat treatment temperature is 1290° C. or more in the heat treatment conditions according to the first embodiment is that the diffusion time when the separation layer 5 of the reverse blocking IGBT is formed can be shorter than that when the heat treatment temperature is less than 1290° C. The diffusion depth d of the diffusion layer is represented by the following Expression (1) when a diffuse coefficient is D and the diffusion time is t.

$$d=\sqrt{(Dt)} \quad \text{[Expression 1]}$$

The diffuse coefficient D is proportional to the heat treatment temperature when impurities are diffused. Therefore, when the diffusion depth d is large, the heat treatment temperature increases, but it is necessary to increase the diffusion time t. Therefore, when the division layer 5 is formed with a predetermined diffusion depth d and the heat treatment temperature is low, the diffusion time t is increased by a value required to reduce the heat treatment temperature. For example, when the separation layer 5 is formed with a depth of 100 μm and the heat treatment temperature is 1280° C., a diffusion time of 150 hours is needed. When the heat treatment temperature is 1300° C., it is possible to reduce the diffusion time by 100 hours.

The reason why the heat treatment temperature is less than the melting point of silicon in the heat treatment conditions according to the first embodiment is that, when the heat treatment temperature is equal to or more than the melting point of silicon, the FZ wafer obtained from the crystal rod manufactured by the CZ method is melted. Therefore, it is preferable that the heat treatment temperature be in the range of 1300° C. to 1350° C.

As described above, according to the method of manufacturing the semiconductor device of the first embodiment, it is possible to perform a heat treatment at a high temperature for a long time such that no crystal defect occurs in the FZ wafer obtained from the crystal rod manufactured by the CZ method, regardless of whether a point defect occurs in the FZ wafer obtained from the crystal rod manufactured by the CZ method. Therefore, it is possible to perform a heat treatment at a high temperature for a long time to manufacture a reverse blocking IGBT, without a crystal defect in the FZ wafer obtained from the crystal rod manufactured by the CZ method. In this way, it is possible to prevent the occurrence of a reverse breakdown voltage defect or a forward defect in the reverse blocking IGBT. Therefore, it is possible to improve yield. In addition, since the heat treatment can be performed at a high temperature for a long time such that no crystal defect occurs in the FZ wafer obtained from the crystal rod manufactured by the CZ method, it is possible to form the separation layer of the reverse blocking IGBT using the thermal diffusion process which is performed in a shorter time than that in the related art.

Furthermore, according to the method of manufacturing the semiconductor device of the first embodiment, it is possible to manufacture, for example, a reverse blocking IGBT using the FZ wafer obtained from the crystal rod manufactured by the CZ method which has the same quality characteristics as the FZ wafer manufactured using polycrystalline silicon as a raw material and whose diameter can be easily increased. Therefore, it is possible to reduce costs and improve yield.

(Second Embodiment)

Next, a method of manufacturing a semiconductor device according to a second embodiment will be described. The method of manufacturing the semiconductor device according to the second embodiment is a modification of the method of manufacturing the semiconductor device according to the first embodiment. The method of manufacturing the semiconductor device according to the second embodiment differs from the method of manufacturing the semiconductor device according to the first embodiment in that the semiconductor device according to the second embodiment is manufactured using the FZ wafer which is manufactured using polycrystalline silicon as a raw material. That is, in the method of manufacturing the semiconductor device according to the second embodiment, a heat treatment is performed on the FZ wafer manufactured using polycrystalline silicon as a raw material at a high temperature for a long time in an inert gas atmosphere under the heat treatment conditions according to the first embodiment.

Next, the internal state of a crystal of the FZ wafer (hereinafter, referred to as a second example) manufactured using polycrystalline silicon as a raw material which has been subjected to the heat treatment under the heat treatment conditions according to the first embodiment will be described. First, the heat treatment was performed on the FZ wafer manufactured using polycrystalline silicon as a raw material under the heat treatment conditions according to the first embodiment to manufacture the FZ wafer manufactured using polycrystalline silicon as a raw material according to the second example. Specifically, the same heat treatment as that for the FZ wafer obtained from the crystal rod manufactured by the CZ method according to the first example was performed on the FZ wafer manufactured using polycrystalline silicon as a raw material according to the second example.

Then, the X-ray topographic image of the FZ wafer manufactured using polycrystalline silicon as a raw material according to the second example was captured and the internal state of a crystal of each sample was observed. The observation result proved that, similarly to the FZ wafer obtained from the crystal rod manufactured by the CZ method according to the first example, no crystal defect occurred in the FZ wafer manufactured using polycrystalline silicon as a raw material according to the second example. The reason is presumed as follows. Since the heat treatment is performed in an inert gas atmosphere, such as an argon atmosphere, there is no nitrogen in the atmosphere. Even when the heat treatment is performed at a high temperature for a long time, nitrogen is not injected into the FZ wafer manufactured using polycrystalline silicon as a raw material.

Next, the reverse breakdown voltage characteristics of the semiconductor device according to the second embodiment were verified. First, a reverse blocking IGBT was manufactured by the method of manufacturing the semiconductor device according to the second embodiment (hereinafter, referred to as a reverse blocking IGBT according to the second example). That is, a thermal diffusion process for forming the separation layer 5 of the reverse blocking IGBT according to the second example is performed under the same heat treatment conditions as those in the heat treatment for the FZ wafer manufactured using polycrystalline silicon as a raw material according to the second example. The heat treatment conditions of a method of manufacturing the reverse blocking IGBT according to the second example are the same as those of the method of manufacturing the reverse blocking IGBT according to the first example.

Then, the reverse breakdown voltage characteristics of the reverse blocking IGBT according to the second example were measured. The measurement result proved that the same good breakdown voltage characteristics as those of the reverse blocking IGBT according to the first example were obtained. The reason is the same as that in the reverse blocking IGBT according to the first example. These results proved that, when the heat treatment was performed under the heat treatment conditions according to the first embodiment, no crystal defect occurred regardless of the kind of raw material for forming the semiconductor wafer. Therefore, when the heat treatment is performed under the heat treatment conditions according to the first embodiment, it is possible to prevent the occurrence of a reverse breakdown voltage defect or a forward defect in the semiconductor element and improve the yield of the semiconductor element.

As described above, according to the method of manufacturing the semiconductor device of the second embodiment, it is possible to obtain the same effect as that obtained by the method of manufacturing the semiconductor device according to the first embodiment.

(Third Embodiment)

Next, a method of manufacturing a semiconductor device according to a third embodiment will be described. The method of manufacturing the semiconductor device according to the third embodiment differs from the method of manufacturing the semiconductor device according to the second embodiment in that a heat treatment is performed on the FZ wafer made from polycrystalline silicon as a raw material at a high temperature for a long time in a nitrogen atmosphere (hereinafter, referred to as heat treatment conditions according to the third embodiment). The heat treatment conditions according to the third embodiment are similar to the heat treatment conditions according to the first embodiment except for a component included in the atmosphere.

The internal state of a crystal of the FZ wafer (hereinafter, referred to as a third example) manufactured using polycrystalline silicon as a raw material which has been subjected to the heat treatment under the heat treatment conditions according to the third embodiment will be described. First, a heat treatment was performed on the FZ wafer manufactured using polycrystalline silicon as a raw material under the heat treatment conditions according to the third embodiment to manufacture the FZ wafer manufactured using polycrystalline silicon as a raw material according to the third example. Then, the X-ray topographic image of the FZ wafer manufactured using polycrystalline silicon as a raw material according to the third example was captured and the internal state of a crystal of each sample was observed.

Specifically, since the FZ wafer manufactured using polycrystalline silicon as a raw material according to the third example is the FZ wafer manufactured using polycrystalline silicon as a raw material according to the second comparative example, as illustrated in FIG. 2(b), the X-ray topographic image of the FZ wafer 31-2 manufactured using polycrystalline silicon as a raw material according to the second comparative example is obtained. Therefore, no crystal defect occurs in the FZ wafer manufactured using polycrystalline silicon as a raw material according to the third example. The reason is the same as that in the FZ wafer 31-2 manufactured using polycrystalline silicon as a raw material according to the second comparative example.

Next, the reverse breakdown voltage characteristics of the semiconductor device according to the third embodiment were verified. First, a reverse blocking IGBT was manufactured by the method of manufacturing the semiconductor device according to the third embodiment (hereinafter, referred to as a reverse blocking IGBT according to the third example). That is, a thermal diffusion process for forming the separation layer 5 of the reverse blocking IGBT according to the third example is performed under the same heat treatment conditions as those in the heat treatment for the FZ wafer manufactured using polycrystalline silicon as a raw material according to the third example. A method of manufacturing the reverse blocking IGBT according to the third example is similar to the method of manufacturing the reverse blocking IGBT according to the second example except for the heat treatment conditions.

Then, the reverse breakdown voltage characteristics of the reverse blocking IGBT according to the third example were measured. The measurement result proved that the same good breakdown voltage characteristics as those of the reverse blocking IGBT according to the first example were obtained. This is because a crystal defect does not occur, similarly to the FZ wafer manufactured using polycrystalline silicon as a raw material according to the second comparative example. These results proved that, when the FZ wafer manufactured using polycrystalline silicon as a raw material was used, no crystal defect occurred regardless of the kind of components included in the atmosphere. Therefore, when the FZ wafer manufactured using polycrystalline silicon as a raw material is used to manufacture a semiconductor device, it is possible to prevent the occurrence of a reverse breakdown voltage defect or a forward defect in a semiconductor element and improve the yield of the semiconductor element.

As described above, according to the method of manufacturing the semiconductor device of the third embodiment, it is possible to obtain the same effect as that obtained by the method of manufacturing the semiconductor device according to the second embodiment.

(Fourth Embodiment)

Next, a method of manufacturing a semiconductor device according to a fourth embodiment will be described. There are two differences between the method of manufacturing the semiconductor device according to the fourth embodiment and the method of manufacturing the semiconductor device according to the first embodiment. The first difference is that a heat treatment is performed on the FZ wafer obtained from the crystal rod manufactured by the CZ method at a high temperature for a long time in a nitrogen atmosphere (hereinafter, referred to as heat treatment conditions according to the fourth embodiment). The second difference is that a crystal defect which occurs in the FZ wafer obtained from the crystal rod manufactured by the CZ method is removed. The heat treatment conditions according to the fourth embodiment are similar to the heat treatment conditions according to the first embodiment except for a component included in the atmosphere.

First, a phenomenon which occurs in the FZ wafer obtained from the crystal rod manufactured by the CZ method due to the first difference from the method of manufacturing the semiconductor device according to the first embodiment will be described. FIG. 4 is a cross-sectional view illustrating a situation in which a crystal defect occurs in a semiconductor wafer. When a heat treatment is performed on an FZ wafer 51 obtained from the crystal rod manufactured by the CZ method at a high temperature for a long time in a nitriding atmosphere, a crystal defect occurs in the FZ wafer 51 obtained from the crystal rod manufactured by the CZ method, similarly to, for example, the FZ wafer obtained from the crystal rod manufactured by the CZ method according to the first comparative example. Specifically, as illustrated in FIG. 4(a), a crystal defect occurs in a central portion 52 of the FZ wafer 51 obtained from the crystal rod manufactured by the CZ method (with substantially the same depth from the front and rear surfaces of the FZ wafer 51 obtained from the crystal rod manufactured by the CZ method) in a direction parallel to the main surface of the FZ wafer 51 obtained from the crystal rod manufactured by the CZ method (hereinafter, referred to as a crystal defect region 52).

The reason why the crystal defect region 52 is formed in the central portion of the FZ wafer 51 obtained from the crystal rod manufactured by the CZ method is as follows. In the central portion of the FZ wafer 51 obtained from the crystal rod manufactured by the CZ method, oxygen or nitrogen is less likely to diffused to the outside of the FZ wafer 51 obtained from the crystal rod manufactured by the CZ method. Therefore, when a heat treatment is performed on the FZ wafer 51 obtained from the crystal rod manufactured by the CZ method, oxygen or nitrogen in the atmosphere is deposited as a precipitate in the central portion of the FZ wafer 51 obtained from the crystal rod manufactured by the CZ method. When the heat treatment temperature increases or when the heat treatment time increases, the precipitate formed in the central portion of the FZ wafer 51 obtained from the crystal rod manufactured by the CZ method is grown.

When the heat treatment temperature is low and/or the heat treatment time is short, the thickness t1 of the crystal defect region 52 is less than the thicknesses t2-1 and t2-2 of regions 53-1 and 53-2 in which no crystal defect occurs in the front and rear surfaces of the FZ wafer 51 obtained from the crystal rod manufactured by the CZ method. The thickness t2-1 of the region 53-1 in which no crystal defect occurs in the front surface of the FZ wafer 51 obtained from the crystal rod manufactured by the CZ method is substantially equal to the thickness t2-2 of the region 53-2 in which no crystal defect occurs in the rear surface of the FZ wafer 51 obtained from the crystal rod manufactured by the CZ method.

As illustrated in FIG. 4(b), as the heat treatment temperature increases or as the heat treatment time increases, the thickness t1 of the crystal defect region 52 increases. Therefore, as the heat treatment time increases or as the heat treatment temperature increases, the thicknesses t2-1 and t2-2 of the regions 53-1 and 53-2 in which no crystal defect occurs in the front and rear surfaces of the FZ wafer 51 obtained from the crystal rod manufactured by the CZ method are reduced.

Specifically, for example, when the furnace input temperature and the furnace output temperature are 700° C., the rate of temperature increase or decrease of the surface of the FZ wafer 51 obtained from the crystal rod manufactured by the CZ method is 1° C./min, and a heat treatment is performed at a temperature of 1300° C. in a nitrogen atmosphere including 30% of oxygen ($O_2$) and 70% of nitrogen, the thicknesses t2-1 and t2-2 of the regions 53-1 and 53-2 in which no crystal defect occurs are as follows. It is assumed that the thickness t0 of the FZ wafer 51 obtained from the crystal rod manufactured by the CZ method is, for example, 500 μm. When the heat treatment time is 50 hours, the regions 53-1 and 53-2 in which no crystal defect occurs are formed with a depth of 140 μm (t2-1=t2-2=140 μm) in the front and rear surfaces of the FZ wafer 51 obtained from the crystal rod manufactured by the CZ method. However, when the heat treatment time is 100 hours, the thicknesses t2-1 and t2-2 of the regions 53-1 and 53-2 in which no crystal defect occurs are reduced to 60 μm.

Figure 5:
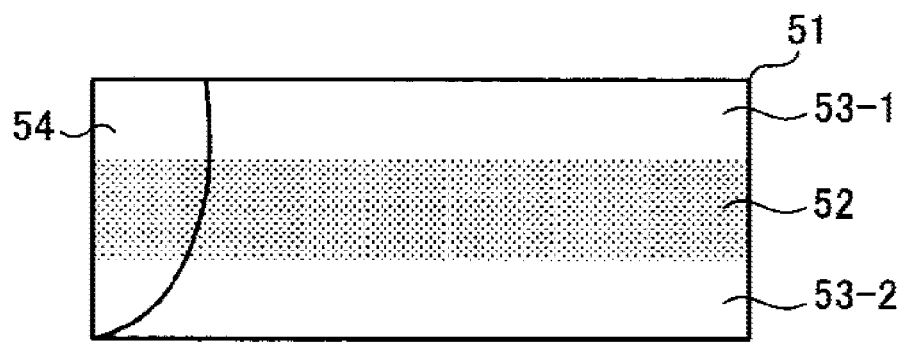
FIG. 5 is a cross-sectional view illustrating a semiconductor device according to a fourth embodiment which is being manufactured.
Figure 6:
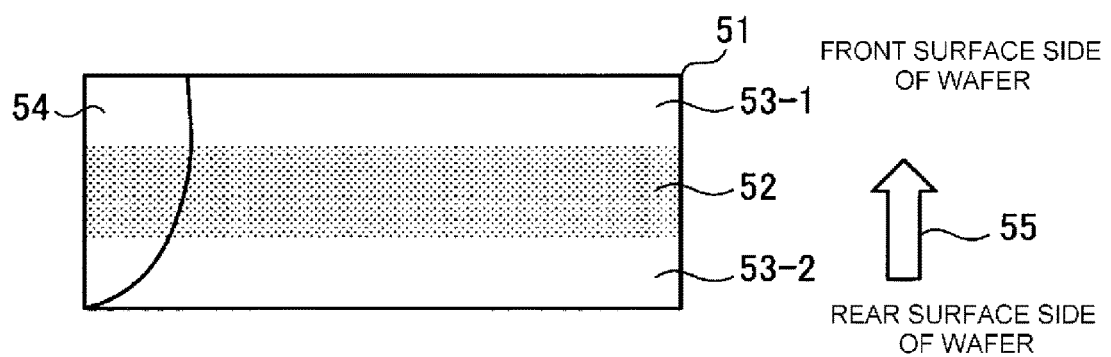
FIG. 6 is a cross-sectional view illustrating the semiconductor device according to the fourth embodiment which is being manufactured.
Figure 7:
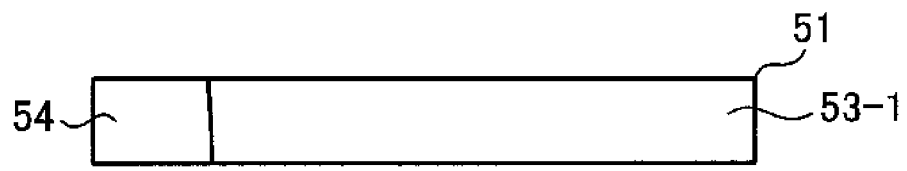
FIG. 7 is a cross-sectional view illustrating the semiconductor device according to the fourth embodiment which is being manufactured.

The crystal defect which occurs in the FZ wafer obtained from the crystal rod manufactured by the CZ method, which is the second difference from the method of manufacturing the semiconductor device according to the first embodiment, is removed to obtain the semiconductor device according to the fourth embodiment without a crystal defect. Specifically, the method of manufacturing the semiconductor device according to the fourth embodiment will be described. FIGS. 5 to 7 are cross-sectional views illustrating the semiconductor device according to the fourth embodiment which is being manufactured. For example, an example of the manufacture of a reverse blocking IGBT will be described. First, as illustrated in FIG. 5, similarly to the method of manufacturing the semiconductor device according to the first embodiment, a process of forming a separation layer 54 on the front surface of the FZ wafer 51 obtained from the crystal rod manufactured by the CZ method is performed.

The separation layer 54 is formed by a thermal diffusion process so as to reach the rear surface of the FZ wafer 51 obtained from the crystal rod manufactured by the CZ method. The crystal defect region 52 is formed in the FZ wafer 51 obtained from the crystal rod manufactured by the CZ method by the thermal diffusion process for forming the separation layer 54. Then, a front surface element structure (not illustrated) of the reverse blocking IGBT is formed in the front surface of the FZ wafer 51 obtained from the crystal rod manufactured by the CZ method. Then, as illustrated in FIG. 6, the rear surface of the FZ wafer 51 obtained from the crystal rod manufactured by the CZ method is ground until the region 53-1 in which no crystal defect occurs in the front surface of the FZ wafer 51 obtained from the crystal rod manufactured by the CZ method is exposed to remove the crystal defect region 52 and the region 53-2 in which no crystal defect occurs in the rear surface of the FZ wafer 51 obtained from the crystal rod manufactured by the CZ method (reference numeral 55 indicates a grinding direction).

In this way, as illustrated in FIG. 7, the region 53-1 in which no crystal defect occurs in the front surface of the FZ wafer 51 obtained from the crystal rod manufactured by the CZ method and the separation layer 54 formed in the region 53-1 in which no crystal defect occurs in the front surface of the FZ wafer 51 obtained from the crystal rod manufactured by the CZ method remain. Then, for example, boron ions are implanted into the ground rear surface of the FZ wafer 51 obtained from the crystal rod manufactured by the CZ method and laser annealing is performed to form a p$^+$ collector region on the ground rear surface of the FZ wafer 51 obtained from the crystal rod manufactured by the CZ method so as to come into contact with the separation layer 54. Then, a collector electrode is formed so as to come into contact with the p$^+$ collector region. In this way, a rear surface element structure of the reverse blocking IGBT including the p$^+$ collector region and the collector electrode is formed and the reverse blocking IGBT is completed.

In the method of manufacturing the semiconductor device according to the fourth embodiment, after the separation layer 54 is formed and the front surface element structure of the reverse blocking IGBT is formed, the FZ wafer 51 obtained from the crystal rod manufactured by the CZ method is thinned. However, after the separation layer 54 is formed and the FZ wafer 51 obtained from the crystal rod manufactured by the CZ method is thinned, the front surface element structure of the reverse blocking IGBT may be formed. In addition, during the thermal diffusion process for forming the separation layer 54, the thickness t2-1 of the region 53-1 in which no crystal defect occurs in the front surface of the FZ wafer 51 obtained from the crystal rod manufactured by the CZ method needs to be more than a predetermined thickness which is determined by a breakdown voltage class such that no crystal defect remains in the completed reverse blocking IGBT. Therefore, it is preferable to appropriately adjust the thermal diffusion temperature and the thermal diffusion time of the thermal diffusion process for forming the separation layer 54.

The method of manufacturing the semiconductor device according to the fourth embodiment is similar to the method of manufacturing the semiconductor device according to the first embodiment except for the above-mentioned two differences.

As described above, according to the method of manufacturing the semiconductor device of the fourth embodiment, the heat treatment is performed on the FZ wafer obtained from the crystal rod manufactured by the CZ method at a high temperature for a long time in the nitrogen atmosphere. Therefore, even when a crystal defect occurs, it is possible to manufacture, for example, a reverse blocking IGBT so as not to include the crystal defect which occurs in the FZ wafer obtained from the crystal rod manufactured by the CZ method. As a result, it is possible to obtain the same effect as that obtained by the method of manufacturing the semiconductor device according to the first embodiment.

In the invention, the reverse blocking IGBT has been described as an example, but the invention is not limited to the above-described embodiments. The invention can be applied to various semiconductor devices with a deep diffusion layer. In addition, the above-mentioned method of manufacturing the reverse blocking IGBT is an illustrative example, and can be changed in various ways according to the structure of the reverse blocking IGBT. For example, the order in which the front surface element structure including the emitter region or the gate structure, the rear surface element structure including the collector region, and the separation layer are formed may be changed in various ways. In the above-described embodiments, the first conductivity type is an n type and the second conductivity type is a p type. However, in the invention, the first conductivity type may be a p type and the second conductivity type may be an n type. In this case, the same effect as described above is obtained.

INDUSTRIAL APPLICABILITY

As described above, the method of manufacturing the semiconductor device according to the invention is useful for power semiconductor devices which are used in power conversion devices, such as inverters, or various industrial machines.

The invention claimed is:

1. A method of manufacturing a semiconductor device comprising:
    providing a silicon wafer manufactured by a floating method from a polycrystalline silicon ingot, the silicon wafer having a first main surface and a second main surface that are opposite to each other;
    forming an oxide layer on the first main surface of the silicon wafer, the oxide layer having an opening through which the silicon wafer is exposed and in which a diffusion source is filled; and
    performing heat treatment to the silicon wafer with the oxide layer formed thereon, to thereby diffuse impurity from the diffusion source at the first main surface to the second main surface of the silicon wafer, so as to create a diffusion layer that forms a pn junction with the silicon wafer, wherein
    the heat treatment is performed for a time that is at least as long as a time for forming the diffusion layer with a predetermined diffusion depth of 100 μm, and
    the entire heat treatment has a single heat treatment step that is performed in a diffusion furnace, in a nitrogen-free inert gas atmosphere and at a temperature that is more than 1300° C. and no more than 1350° C.

2. The method of manufacturing a semiconductor device according to claim 1, wherein a main component of the atmosphere is argon.

3. The method of manufacturing a semiconductor device according to claim 1, wherein the diffusion layer is a layer of a second-conductivity-type,
    the silicon wafer forms a first-conductivity-type drift layer of a reverse blocking insulated gate bipolar transistor, and
    in the diffusion step, the second-conductivity-type diffusion layer is diffused so as to reach a second-conductivity-type collector region which is formed in the second main surface of the silicon wafer before or after the diffusion step.

4. The method of manufacturing a semiconductor device according to claim 1, wherein a diffusion depth of the diffusion layer is a depth measured in a direction perpendicular to the first main surface.

5. A method of manufacturing a semiconductor device comprising:
   a step of providing a silicon wafer, wherein the silicon wafer has been manufactured by a floating method from a single crystal silicon ingot made by the Czochralski method, and has a first main surface and a second main surface that are opposite to each other;
   a step of forming an oxide layer on the first main surface of the silicon wafer, the oxide layer having an opening through which the silicon wafer is exposed and in which a diffusion source is filled; and
   a diffusion step of performing heat treatment to the silicon wafer with the oxide layer formed thereon, to thereby diffuse impurity from the diffusion source at the first main surface to the second main surface of the silicon wafer, so as to create a diffusion layer that forms a pn junction with the silicon wafer, wherein
   the heat treatment is performed for a time that is at least as long as a time for forming the diffusion layer with a predetermined diffusion depth of 100 μm, and
   the entire heat treatment has a single heat treatment step that is performed in a diffusion furnace, in a nitrogen-free inert gas atmosphere and at a temperature that is more than 1300° C. and no more than 1350° C.

6. The method of manufacturing a semiconductor device according claim 5, wherein
   the diffusion layer is a layer of a second-conductivity-type,
   the silicon wafer forms a first-conductivity-type drift layer of a reverse blocking insulated gate bipolar transistor, and
   in the diffusion step, the second-conductivity-type diffusion layer is diffused so as to reach a second-conductivity-type collector region which is formed in the second main surface of the silicon wafer before or after the diffusion step.

7. The method of manufacturing a semiconductor device according to claim 5, further comprising a grinding step of grinding one main surface of the silicon wafer until a region including a crystal defect which occurs in the silicon wafer due to the heat treatment is removed.

8. The method of manufacturing a semiconductor device according claim 5, wherein a diffusion depth of the diffusion layer is a depth measured in a direction perpendicular to the first main surface.

* * * * *